(12) United States Patent
Yvind et al.

(10) Patent No.: US 9,438,009 B2
(45) Date of Patent: Sep. 6, 2016

(54) WAVELENGTH TUNABLE PHOTON SOURCE WITH SEALED INNER VOLUME

(71) Applicant: Danmarks Tekniske Universitet, Lyngby (DK)

(72) Inventors: Kresten Yvind, Virum (DK); Thor Ansbæk, Roskilde (DK)

(73) Assignee: Danmarks Tekniske Universitet, Lyngby (DK)

( * ) Notice: Subject to any disclaimer, the term of this patent is extended or adjusted under 35 U.S.C. 154(b) by 0 days.

(21) Appl. No.: 14/888,923

(22) PCT Filed: May 30, 2014

(86) PCT No.: PCT/DK2014/050153
§ 371 (c)(1),
(2) Date: Nov. 3, 2015

(87) PCT Pub. No.: WO2014/191005
PCT Pub. Date: Dec. 4, 2014

(65) Prior Publication Data
US 2016/0079736 A1 Mar. 17, 2016

(30) Foreign Application Priority Data

May 31, 2013 (EP) .................................... 13170138
Dec. 16, 2013 (DK) ................................ 2013 70779

(51) Int. Cl.
*H01S 3/10* (2006.01)
*H01S 5/10* (2006.01)
(Continued)

(52) U.S. Cl.
CPC ......... *H01S 5/1096* (2013.01); *G01B 9/02002* (2013.01); *H01S 5/0614* (2013.01);
(Continued)

(58) Field of Classification Search
CPC .. H01S 5/1096; H01S 5/1092; H01S 5/0614; H01S 5/18341; H01S 5/18316; H01S 5/183
USPC ............................................... 372/20, 50.124
See application file for complete search history.

(56) References Cited

U.S. PATENT DOCUMENTS 6,275,513 B1 * 8/2001 Chang-Hasnain .... H01S 5/0222
372/107
6,546,029 B2 4/2003 Sirbu et al.
(Continued)

FOREIGN PATENT DOCUMENTS

WO WO 00/76038 A1 12/2000
WO WO 02/084826 A1 10/2002
(Continued)

OTHER PUBLICATIONS

Cole, Garrett D. et al., "Dynamic Characterization of MEMS-Tunable Vertical-Cavity SOAs" Conference Proceedings, 2005.
(Continued)

*Primary Examiner* — Kinam Park
(74) *Attorney, Agent, or Firm* — Knobbe Martens Olson & Bear LLP

(57) ABSTRACT

There is presented a method of providing a wavelength tunable photon source (200), comprising bonding a first element (101) with a first mirror (106), a second element (102) with a second mirror (108) and a third element (103) with a photon emitter together in a structure enclosing an inner volume (214) being a sealed volume, and forming a bonding interface (212) which is gas-tight, so that the first mirror (106) is placed in the inner volume (214) so the first mirror (106) may move within the inner volume (214). The method provides a relatively simple way of obtaining a tunable photon source where the inner volume is sealed. The invention furthermore relates to a corresponding photon source, and use of such photon source.

22 Claims, 5 Drawing Sheets

(51) Int. Cl.
*H01S 5/183* (2006.01)
*G01B 9/02* (2006.01)
*H01S 5/06* (2006.01)
*H01S 5/02* (2006.01)

(52) U.S. Cl.
CPC .............. *H01S5/1042* (2013.01); *H01S 5/183* (2013.01); *H01S 5/1838* (2013.01); *H01S 5/18316* (2013.01); *H01S 5/18341* (2013.01); *H01S 5/18358* (2013.01); *H01S 5/18366* (2013.01); *H01S 5/021* (2013.01); *H01S 5/18311* (2013.01)

(56) References Cited

U.S. PATENT DOCUMENTS

| | | | |
|---|---|---|---|
| 2002/0131458 | A1 | 9/2002 | Sirbu et al. |
| 2002/0150130 | A1* | 10/2002 | Coldren .............. H01S 5/18305 372/20 |
| 2012/0008658 | A1* | 1/2012 | Chung ...................... H01S 5/10 372/45.01 |
| 2015/0288146 | A1* | 10/2015 | Chang-Hasnain ...... H01S 5/021 372/50.11 |

FOREIGN PATENT DOCUMENTS

| | | |
|---|---|---|
| WO | WO 2010/091688 A1 | 8/2010 |
| WO | WO 2012/149497 A2 | 11/2012 |

OTHER PUBLICATIONS

Cole, Garrett D. et al., "Short-wavelength MEMS-tunable VCSELs" Optics Express, Sep. 29, 2008, pp. 16093-16103, vol. 16, No. 20.
Goeman, S. et al., "First Demonstration of Highly Reflective and Highly Polarization Selective Diffraction Gratings (GIRO-Gratings) for Long-Wavelength VCSEL's" IEEE Photonics Technology Letters, Sep. 1998, pp. 1205-1207, vol. 10, No. 9.
Kanbara, Nobuhiko et al., "MEMS Tunable VCSEL with Concave Mirror using the Selective Polishing Method" 2006, pp. 9 and 10.
Kim, Bioh et al., "Wafer Bonding Techniques" 3D Integration for VLSI Systems, 2012, pp. 43-70.
Leidich, Stefan et al., "Microwave Phase Shifter with Electromagnetic Signal Coupling in Silicon Bulk Technology" International Journal of Microwave and Optical Technology, Jun. 2006, pp. 1-9, vol. 1, No. 1.
Neumann, Norbert et al., "A Tunable Fabry-Perot-Interferometer for 3-4.5 μm Wavelength with Bulk Micromachined Reflector Carrier" Proc. SPIE 4983, MOEMS and Miniaturized Systems III, Jan. 21, 2003, pp. 1-14.
Nobuhiko, Kanbara et al., "High speed micromechanically tunable Surface Emitting Laser with SI-MEMS technology" Yokogawa Technical Report English Edition, 2009, pp. 45-48, No. 47.
International Search Report for PCT/DK2014/050153 dated Sep. 19, 2014.

* cited by examiner

WAVELENGTH TUNABLE PHOTON SOURCE WITH SEALED INNER VOLUME

CROSS REFERENCE TO RELATED APPLICATIONS

This application is a U.S. National Phase Application of PCT International Application Number PCT/DK2014/050153, filed on May 30, 2014, designating the United States of America and published in the English language, which is an International Application of and claims the benefit of priority to European Patent Application No. 13170138.5, filed on May 31, 2013, and Danish Patent Application No. PA 2013 70779, filed on Dec. 16, 2013. The disclosures of the above-referenced applications are hereby expressly incorporated by reference in their entireties.

FIELD OF THE INVENTION

The present invention relates to a photon source, more specifically the invention relates to a wavelength tunable photon source.

BACKGROUND OF THE INVENTION

Wavelength tunable photon sources may be applied for a number of applications, where it may be advantageous to be able to adjust the emitted wavelength.

The reference "*High speed micromechanically tunable Surface Emitting Laser with Si-MEMS technology*", KANBARA Nobuhiko, et al., Yokogawa Technical Report English Edition No. 47 (2009), describes a tunable surface emitting laser. This laser consists of a half VCSEL (Vertical Cavity Surface Emitting Laser) chip without a one-side dielectric mirror and a micromachined SOI (Silicon on Insulator) substrate with a concave mirror. These two chips are bonded together using a high-accuracy metal thermo compression bonding method. High-speed, wide-wavelength tuning is achieved by applying a variable voltage between the silicon membrane with the mirror and the silicon substrate. In the prototype, we have achieved high performance wavelength modulation over 500 kHz, a wide tuning range of 55 nm without any mode-hop, and a side mode suppression ratio of over 60 dB.

An improved tunable photon source would be advantageous.

SUMMARY OF THE INVENTION

It may be seen as an object of the present invention to provide a method of providing an improved wavelength tunable photon source. It is a further object of the present invention to provide an alternative to the prior art.

Thus, the above described object and several other objects may be obtained in a first aspect of the invention by providing a method of providing a wavelength tunable photon source, the method comprising
 providing a first element, such as the first element being a solid element, comprising a first mirror,
 providing a second element, such as the second element being a solid element, comprising a second mirror,
 providing a third element, such as the third element being a solid element, comprising a photon emitter,
 placing the first element and the second element and the third element in relation to each other, so that
  i. the first mirror and the second mirror define at least a part of an optical cavity, and so that
  ii. the photon emitter is placed inside the optical cavity,
 joining, such as by bonding and/or deposition, such as via physical and/or chemical bonds, at least the first element and the second element and the third element together in a coherent structure, such as a coherent structure held together by physical and/or chemical forces, such as a rigid and coherent structure, enclosing an inner volume being a sealed volume, such as sealed so that air and/or liquid cannot get in or out of the inner volume, such as the sealed inner volume being hermetically sealed, such as a non-solid inner volume, and
 forming a bonding interface adjacent to the inner volume, which bonding interface is gas-tight, abutting on a first side the first element and on a second side the the third element,
wherein
 the first mirror is placed in the inner volume so that the first mirror may move, such as move with respect to the second mirror, within the inner volume, and wherein the method further comprises
  providing means for enabling moving the first mirror within the inner volume, such as means for electrically accessing the first mirror, such as means for electrostatically moving the first mirror, such as moving the first mirror so as to enable changing a cavity length of the optical cavity.

The invention is particularly, but not exclusively, advantageous for obtaining a wavelength tunable photon source, since the method provides a relatively simple way of obtaining such source where the inner volume is sealed. Having a sealed inner volume may be seen as advantageous since it enables controlling the atmosphere (such as pressure and fluid composition), which may in turn enable improving the Q-factor of the first mirror (such as increasing the Q-factor to enable larger amplitude of movement or decreasing the Q-factor so as to avoid ringing). Furthermore, the sealed inner volume may enable the photon source to be more stable and/or robust against contamination, since contaminants are kept out of the inner volume. The method provides a simple yet effective way of combing the first, second and third elements such that the first element double functions as a first mirror and a boundary wall for the inner volume and wherein the second element and/or the third element similarly double functions, respectively as second mirror/photon emitter, and a boundary wall for the inner volume.

The invention may be seen as being based on the insight that bonding the elements together as described may be sufficient in realizing a sealed inner volume wherein the first mirror can be moved. It may be noted, that when referring to "wherein the first mirror can be moved" and/or "so that the first mirror may move within the inner volume", it is in general to be understood, that the first mirror may move inside the first volume, such as the first mirror being movably suspended within the first volume, such as the first mirror may move within the first volume without necessitating movement of structural features outside of the first volume, such as the first mirror not being confined to move together with an outer wall bounding the inner volume. It may be seen as an advantage of arranging the first mirror so that it can be moved within the first volume, that the mechanical properties of the first mirror can be controlled, such as directly controlled, by controlling a fluid composition, such as the pressure of a gas in the first volume. It may be seen as an advantage of arranging the first mirror so that it can be moved within the first volume, that the mechanical properties of the first mirror are not affected by a pressure of fluid outside the inner volume, such as the atmospheric conditions.

By 'wavelength tunable photon source' is understood a source of photons wherein the wavelength of the photons may be controllably adjusted.

By 'first element' may be understood a structural element comprising a first mirror.

By 'first mirror' may be understood a mirror capable of defining a mirror surface in an optical cavity. It is understood that the first mirror may move, such as move with respect to the second mirror, such as move so as to change an optical path length of the optical cavity. It may be understood that the first mirror may be at least a part of a micro-electromechanical system (MEMS) structure, such as the first mirror may be a MEMS structure, wherein said MEMS structure is placed in the inner volume so that said MEMS structure may move, such as move with respect to the second mirror, within the inner volume. It may be understood that said MEMS structure is placed in the inner volume and that at least a portion of the inner volume is placed on a side of said MEMS structure facing the optical cavity and where at least a portion of the inner volume, such as another portion of the inner volume, is placed on an opposite side of the MEMS structure, such as a side of said MEMS structure being opposite of the side of said MEMS structure facing the optical cavity.

In a particular embodiment, the first element may be formed by a high-index-contrast subwavelength grating (HCG) pre-patterned silicon-on-insulator (SOI) substrate, which may comprise a buried HCG, such as the HCG disposed between spacing layers as a lower mirror reflector, as described in WO2012/0149497A2 which is hereby incorporated by reference in entirety.

By 'second element' may be understood a structural element comprising a second mirror.

By 'second mirror' may be understood a mirror capable of defining a mirror surface in an optical cavity. In some embodiments, the second element may substantially be embodied, such consist of, the second mirror, such as the second element being the second, such as the second element being the second mirror deposited onto another element, such as deposited onto the third element.

Any one of the first mirror and/or the second mirror may in exemplary embodiments comprise a distributed Bragg reflector or an HCG. In other embodiments the mirror and/or the second mirror may comprise any one of metal mirrors and/or highly reflective and highly polarization selective diffraction gratings (GIRO-gratings) as described in "*First demonstration of highly reflective and highly polarization selective diffraction gratings (GIRO-gratings) for longwavelength VCSELs*", Goeman S., et al., Photonics Technology Letters, IEEE (Volume:10, Issue: 9), September 1998, Page(s): 1205-1207, which reference is hereby included by reference in its entirety. Combinations of different types of mirrors may be encompassed by the present invention.

In a particular embodiment, the second element may be integrated with the third element in a half-VCSEL laser heterostructure having an upper mirror reflector (i.e., the second mirror), and an active region (i.e., the photon emitter) beneath said upper mirror reflector, such as described in WO2012/0149497A2 which is hereby incorporated by reference in entirety.

By 'third element' may be understood a structural element comprising a photon emitter. By 'photon emitter' may be understood an entity capable of emitting photons, such as capable of emitting photons upon receipt of photons or electrons. Exemplary photon emitters may in general include an optical gain medium (such as laser gain medium). The photon emitter may in some embodiments comprise one or more quantum wells, quantum wires or quantum dots. In a particular embodiment, the photon emitter comprises a semiconductor material, such as a semiconductor in bulk form or in the form of one or more quantum wells, quantum wires or quantum dots. The 'third element' may be bought from commercial suppliers, such as III-V semiconductor epitaxial wafers which may be purchased from epitaxial wafer foundries.

'Optical cavity' is to be understood as is known in the art, and describes an arrangement of mirrors that forms a standing wave cavity resonator for light waves.

By 'the photon emitter is placed inside the optical cavity' (such as the method comprises placing the photon emitter inside the optical cavity) is understood that the photon emitter is placed so as to enable emission of a photon directly into the cavity, such as directly into a cavity mode. By placing the photon emitter inside the cavity, the potential loss of photons entering into the cavity is eliminated. Furthermore, if the photon emitter is an active laser medium, a LASER may be provided.

By 'bonding' is understood a method of joining, such as permanently and/or irreversibly joining, two surfaces by chemical and/or physical forces, such as chemical and/or physical bonds. Bonding, such as permanent bonding, can be achieved using any one of, e.g., fusion bonding, adhesive bonding, thermo-compression bonding or eutectic bonding.

'Fusion bonding' is to be understood as is known in the art, and is achieved by pressing the two surfaces (which may be highly planar and smooth) of the first and second elements, or in general any two elements to be bonded, together so as to form a chemical contact. The bond strength can be increased by annealing at elevated temperature.

'Adhesive bonding' is to be understood as is known in the art, and may be achieved by using a spray or spin-coating polymer, e.g. benzocyclobutene (BCB), as an intermediate layer between the first and second element or in general any two elements to be bonded. After pressing the first and second elements, or in general any two elements to be bonded, together the polymer is cured.

'Thermo-compression bonding' is to be understood as is known in the art, and may be achieved by patterning a metal thin-film (e.g. Au or AuSn) on the first and second element, or in general any two elements to be bonded, and forcing them together under elevated temperature.

'Eutectic bonding' is to be understood as is known in the art, and may be achieved by patterning a metal thin-film, e.g. Au, on the first or second element, or in general any two elements to be bonded, and joining them together at an elevated temperature.

By 'joining' (elements together) may be understood attaching them to each other. In an embodiment, the step of joining comprises one or more steps of bonding. In an embodiment, the step of joining comprises one or more steps of deposition, such as deposition of the second mirror (where the second mirror may be the second element) onto the third element.

By 'coherent structure' is understood a structure comprising one or more elements which are joined to each other so as to form a structure of joined elements, such as a rigid structure of joined elements. In an embodiment, the coherent structure is held together by physical and/or chemical bonds.

By 'sealed volume' is understood a volume which is sealed off, such as sealed off for practical purposes, with respect to a surrounding volume, such as sealed so that gas, such as air, and/or liquid cannot get into the sealed volume, such as cannot get into the sealed volume in practical circumstances. However, it is also understood that 'sealed volume' does not necessarily imply that the sealing is infinitely good. There may be some non-zero leakage. In an embodiment, the sealed inner volume has a leak rate which is lower than corresponding to 10 mbar pr. 10 years (when being placed in standard atmospheric conditions), such as lower than 1 mbar pr. 10 years, such as lower than 0.1 mbar pr. 10 years. In another embodiment, the sealed inner volume has a leak rate of no more than $1 \times 10^{-20}$ cc of gas/sec at 1 atmosphere differential pressure (where cc refers to cubic centimeters), such as no more than $5 \times 10^{-21}$ cc of gas/sec at 1 atmosphere differential pressure, such as no more than $1 \times 10^{-21}$ cc of gas/sec at 1 atmosphere differential pressure, such as no more than $5 \times 10^{-22}$ cc of gas/sec at 1 atmosphere differential pressure, such as no more than $1 \times 10^{-22}$ cc of gas/sec at 1 atmosphere differential pressure.

It is understood that the 'inner volume' is a 'sealed inner volume' and that 'sealed volume' and 'inner volume' may be used interchangeably. It may be understood, that the wavelength tunable photon source (such as the first element and/or the third element, such as the first element, the second element and/or the third element) is structurally stable, such as rigid, against changes in ambient pressure, so that a numerical volume of the sealed volume does not change, such as change significantly, in practical circumstances, such as in changing ambient pressure, such as changing atmospheric pressure.

The 'inner volume' may be provided by having non-through-going holes in the first element and/or the third element, such as the non-through-going hole(s) corresponding to at least part of the inner volume in the final structure. The inner volume may quantitatively correspond to less than 5000 times the cube of the reference wavelength (lambda^3), i.e., less than $5000 \times \lambda_0^3$, such as less than 2500 times the cube of the reference wavelength, such as less than 1000 times the cube of the reference wavelength, such as less than 500 times the cube of the reference wavelength, such as less than 250 times the cube of the reference wavelength, such as less than 110 times the cube of the reference wavelength, such as less than 100 times the cube of the reference wavelength, such as less than 50 times the cube of the reference wavelength, such as less than 10 times the cube of the reference wavelength. An advantage of such relatively small volume may be that it enables small overall, such as outer, dimensions.

'Hermetically sealed' is known in the art and may be understood as a seal being substantially impervious, such as impervious, to fluid, such as a fluid, such as gas or liquid, being unable to get into or out of the hermetically sealed volume.

By 'a non-solid inner volume' may be understood that the inner volume is not solid, such as the inner volume comprising a fluid, such as a gas, such as a liquid.

By 'forming a bonding interface' may be understood joining two elements together via bonding, so that their bonded surfaces form an interface. By 'bonding interface' is understood the interface between two elements which are bonded together. The invention encompasses that the bonding interface comprises additional material besides the material of the two elements, such as material connecting the two elements, and that the bonding interface comprises no material, such as the two elements being bonded directly together. By 'adjacent to the inner volume' is understood that the bonding interface is placed next to and/or in physical contact with, such as encircles, the inner volume.

By 'gas-tight' may be understood that gas cannot pass through, such as a gas-tight interface may encircle a sealed volume. In analogy with 'sealed volume' described above, it is understood, that 'gas-tight' does not necessarily imply that, e.g., a gas-tight bonding interface is infinitely gas-tight. It may be understood that 'gas-tight' in the present context enables forming a 'sealed volume' as described above, such as a sealed volume as described above may be encircled by a 'gas-tight' interface.

By 'abutting' may be understood being adjacent to, such as being in physical contact with.

By 'means for enabling moving the first mirror within the inner volume' may be understood electrical connections to electrodes arranged for electrostatic actuation, electrical connections to piezo-eletrical elements (where the piezo-electrical elements may be arranged for mechanically actuating the first mirror) or electrical connections enabling thermal actuation, such as electrical connections to a resistive bimorph element enabling heating the first mirror via resistive heating.

In another embodiment, there is provided a method wherein forming the bonding interface comprises forming the bonding interface by means of direct bonding. By 'direct bonding' may be understood that silicon and/or compound semiconductor based substrates are bonded to each other by directly bonding, such as fusing, their surfaces together. By 'direct bonding' may also be understood any one of fusion bonding, silicon-to-oxide bonding, oxide-to-oxide bonding. An advantage of this embodiment may be that the bonding interface may be formed with good control over the distance between the elements, since no intermediate layer influences or increases this distance, and furthermore that the distance between the elements may be kept to a minimum. In consequence, the optical cavity length may be well-defined and/or relatively short. It may be understood that in order to prepare the samples for direct bonding, methods, such as chemo-mechanical polishing (CMP), could be used to reduce the surface rougness of the surfaces to be directly bonded below, such as to reduce surface roughness to below 1 nm, such as below 0.5 nm. It may be seen as advantageous, that the silicon and/or compound semiconductor based substrates which are bonded to each other by directly bonding, such as fusing, their surfaces together, may come into contact without necessitating any assistance of significant pressure, electrical field, and/or intermediate layers. It is noted that direct bonding is described in the reference "*3D Integration for VLSI Systems*", Edited by Chuan Seng Tan, Kuan-Neng Chen and Steven J. Koester, by Pan Stanford Publishing Pte. Ltd (2012).

In another embodiment, there is provided a method wherein the step of forming the bonding interface is preceded by a step of providing a pressure above or below an atmospheric pressure, such as a standard atmospheric pressure, or a step of providing a fluid composition being different from atmospheric air, so as to provide a corresponding pressure above or below the atmospheric pressure in the inner volume after the step of forming the bonding interface and/or so as to provide a fluid composition in the inner volume being substantially different from atmospheric air at standard atmospheric pressure, such as the fluid composition being a gas with a pressure above or below standard atmospheric pressure. An advantage of this embodiment may be, that a low pressure facilitates that the first mirror may be moved with less damping, such as the second mirror having a higher Q-factor. An advantage of this embodiment may be, that a high pressure facilitates that the first mirror may be moved with more damping, such as the second mirror being critically damped, which in turn entails faster settling times, i.e., less ringing. In another embodiment, the method may comprise adjusting the gas composition, so as to differ from an atmospheric gas composition. This may be advantageous, e.g., for improving the thermal properties of the gas composition in the inner volume.

In another embodiment, there is provided a method wherein the method comprises placing an anti-reflection (AR) coating on at least a portion of a surface of the third element which delimits the inner volume. Anti-reflection coatings are known in the art, and may for example comprise any one of $TiO_2/SiO_2$, $Al_2O_3$, SiON, BCB. In an embodiment the AR coating is a dielectric coating, such as silicon-oxynitride. In an embodiment, the AR coating has a refractive index substantially equal to the square root of the refractive index of the element upon which it is placed.

In an embodiment there is no anti-reflection coating on at least a portion of a surface, such as on the surface, of the third element which delimits the inner volume, such as the optical cavity defined by the first mirror and the second mirror comprises an additional mirror within said optical cavity.

In another embodiment, there is provided a method wherein the step of forming the bonding interface comprises placing the element so as to abut the second element and/or the third element. This may enable providing in a relatively simple manner a compact photon source. Furthermore, the embodiment may entail integration of parts with benefits associated therewith.

According to a second aspect of the invention, there is provided a wavelength tunable photon source comprising
  a first element comprising a first mirror,
  a second element comprising a second mirror,
  a third element comprising a photon emitter,
  where the first element and the second element and the third element are placed in relation to each other, so that
    i. the first mirror and the second mirror define at least a part of an optical cavity, and so that
    ii. the photon emitter is placed inside the optical cavity,
  where at least the first element and the second element and the third element are joined together, such as bonded together and/or joined via deposition, such as joined via physical and/or chemical bonds, in a coherent structure enclosing a inner volume being a sealed volume, such as sealed so that air and/or liquid cannot get in or out of the inner volume, such as the sealed inner volume being hermetically sealed, such as a non-solid inner volume, and
  where the coherent structure comprises a bonding interface adjacent to the inner volume, which bonding element is gas-tight, abutting on a first side the first element and on a second side the third element,
  wherein
    the first mirror is placed in the inner volume so that the first mirror may move, such as move with respect to the second mirror, within the inner volume, and wherein the wavelength tunable photon source further comprises means for enabling moving the first mirror within the inner volume, such as means for electrically accessing the first mirror, such as means for electrostatically moving the first mirror, such as moving the first mirror so as to enable changing a cavity length of the optical cavity.

This aspect of the invention is particularly, but not exclusively, advantageous in that the photon source according to the present aspect may be implemented according to the method according to the first aspect.

In an embodiment, there is provided a wavelength tunable photon source which is electrically pumped, such as comprising means for electrical pumping, such as electrodes. An advantage of electrical pumping may be that once the structures for electrical pumping are provided, such as the electrodes connected to a pn-junction, the pumping may be carried out merely by supplying electrical current, which may be seen as relatively simple, e.g., compared to supplying photons in the case of optical pumping.

In an embodiment, there is provided a wavelength tunable photon source which is optically pumped, such as comprising means for optical pumping, such as comprising a pump light source, such as a pump laser. The pump light source may emit light having a wavelength being smaller than the reference wavelength. An advantage of optical pumping may be that the structure of the wavelength tunable photon source may be kept relatively simple since the need for, e.g., electrodes in the case of electrical pumping may be dispensed with.

In another embodiment, there is provided a wavelength tunable photon source wherein the means for enabling moving the first mirror within the inner volume comprises an electrode, such as a set of electrodes, for supporting an electrical field between the first mirror and the electrode so as to move the first mirror, such as moving the first mirror in a direction towards or away from the second mirror. The electrode may be electrically accessible from the outside of the wavelength tunable photon source, and may be arranged so that the electrical field enables moving the first mirror via electrostatic actuation. An advantage of this embodiment may be that it enables moving the first mirror in a simple yet efficient way. In an embodiment, the electrode is arranged for moving, such as statically moving, the first mirror away from the second mirror.

In another embodiment, there is provided a wavelength tunable photon source wherein the electrical field is arranged for moving the first mirror in a direction away from the second mirror. An advantage thereof may be that the effects of the so-called pull-in may be mitigated. This may in particular be relevant for applications where the first mirror is driven at a frequency significantly below its resonance frequency, such as statically.

In another embodiment, there is provided a wavelength tunable photon source, wherein the means for enabling moving the first mirror (106) within the inner volume (214) comprises an electrode (418B, 418C) for supporting an electrical field between the first mirror (106) and the electrode so as to move the first mirror, wherein the electrical field is arranged for moving the first mirror (106) in a direction towards the second mirror (108).

In another embodiment, there is provided a wavelength tunable photon source, wherein the means (418B, 418C, 418D) for enabling moving the first mirror (106) within the inner volume (214) comprises
  i. an electrode (418C, 418D) for supporting an electrical field between the first mirror (106) and the electrode so as to move the first mirror, wherein the electrical field is arranged for moving the first mirror (106) in a direction away from the second mirror (108), and
  ii. an electrode (418B, 418C) for supporting an electrical field between the first mirror (106) and the electrode so as to move the first mirror, wherein the electrical field is arranged for moving the first mirror (106) in a direction towards the second mirror (108).

An advantage of being able to move the mirror actively, such as statically, in both directions may be, that it enables greater control over the movement of the mirror, since it enables actively, such as statically, perturbing and/or moving the first mirror in both directions, i.e., both away from and towards the second mirror.

In another embodiment, there is provided a wavelength tunable photon source wherein the photon emitter is a laser gain medium and wherein the wavelength tunable photon source is arranged for enabling emitting laser light. In an embodiment, the wavelength tunable photon source is a wavelength tunable LASER. LASERs are known in the art.

In another embodiment, there is provided a wavelength tunable photon source wherein the first mirror comprises a High-Contrast Grating (HCG). In another embodiment, there is provided a wavelength tunable photon source wherein the optical cavity comprises at least one anti-reflection coating.

In another embodiment, there is provided a wavelength tunable photon source which is arranged for emitting photons at a reference wavelength lambda wherein an optical path length (OPL) between the first mirror and the second mirror is less than 5 times lambda ($5 \times \lambda_0$), such as less than 2.5 times lambda ($2.5 \times \lambda_0$), such as less than 1.5 times lambda ($1.5 \times \lambda_0$). An advantage of a small OPL may be that it enables a relatively larger free spectral range and/or increased tuning efficiency. In an embodiment there is provided an electrically pumped cavity length of less than 4 times lambda ($4 \times \lambda_0$), such as less than 2 times lambda ($2 \times \lambda_0$). In an embodiment there is provided an optically pumped cavity length of less than 3.5 times lambda ($3.5 \times \lambda_0$), such as less than 2.5 times lambda ($2.5 \times \lambda_0$), such as less than 1.5 times lambda ($1.5 \times \lambda_0$).

When referring to 'cavity length', which is used interchangeably with optical cavity length, it is understood to be the optical path length (OPL) for a single pass through the cavity, such as the optical path length between the two mirrors (i.e., first and second mirror). A roundtrip path length may be twice for these linear cavities, and will be twice for a cavity consisting of two mirrors.

By a 'reference wavelength' (lambda ($\lambda_0$)) may be understood the central operating wavelength of the photon source, such as for a plot of laser power against wavelength it would be given as the wavelength of highest intensity, such as the wavelength of highest intensity during normal use, such as when the first mirror is in a non-actuated position. The reference wavelength may in exemplary embodiments be on the order of 1 micrometer, such as within 100 nm-10 micrometer, such as within 350 nm-5.5 micrometer, such as within 800 nm-3 micrometer, such as 350 nm, such as 800 nm, such as 1 micrometer, such as 1.3 micrometer, such as 1.5 micrometer, such as 2 micrometer, such as 3 micrometer, such as 5.5 micrometer, such as 10 micrometer.

In another embodiment, there is provided a wavelength tunable photon source which is arranged for emitting photons at a reference wavelength lambda, wherein a distance along an optical path in the optical cavity in the inner volume between the first mirror and an opposing solid element is less than 1.0 times lambda ($1.0 \times \lambda_0$), such as less than 0.75 times lambda ($0.75 \times \lambda_0$), such as less than 0.5 times lambda ($0.5 \times \lambda_0$), such as less than 0.25 times lambda ($0.25 \times \lambda_0$). An embodiment with the given distance may advantageously be arranged and/or used for dynamic actuation of the first mirror. An advantage of the relatively small distance may be that it enables a correspondingly smaller OPL. By 'opposing solid element' may be understood an element being the first solid medium a photon meets when travelling through non-solid gas or fluid in the inner volume on a path from the first mirror towards the second mirror. In embodiments, the opposing element may be embodied by the third element (possibly including an anti-reflection coating).

In another embodiment, there is provided a wavelength tunable photon source which is arranged for emitting photons at a reference wavelength lambda, wherein a distance along an optical path in the optical cavity in the inner volume between the first mirror and an opposing solid element is less than $\frac{1}{10} \lambda_0$, i.e., 0.1 times lambda ($0.1 \times \lambda_0$), such as less than 0.075 times lambda ($0.075 \times \lambda_0$), such as less than 0.05 times lambda ($0.05 \times \lambda_0$), such as less than 0.025 times lambda ($0.025 \times \lambda_0$), such as less than 0.01 times lambda ($0.01 \times \lambda_0$). An embodiment with the given distance may advantageously be arranged and/or used for static actuation of the first mirror. An advantage of the relatively small distance may be that it enables a correspondingly smaller OPL. In particular embodiments, the distance may be less than 1.0 times lambda ($1.0 \times \lambda_0$), such as less than 0.75 times lambda ($0.75 \times \lambda_0$), such as less than 0.5 times lambda ($0.5 \times \lambda_0$), such as less than 0.25 times lambda ($0.25 \times \lambda_0$).

In another embodiment, there is provided a wavelength tunable photon source, which is arranged for emitting photons at a reference wavelength lambda, wherein an area delimited by the bonding interface is less than 5000 times the square of the reference wavelength (lambda^2), i.e., less than $5000 \times \lambda_0$, such as less than 2500 times the square of the reference wavelength, such as less than 1000 times the square of the reference wavelength, such as less than 500 times the square of the reference wavelength, such as less than 250 times the square of the reference wavelength, such as less than 100 times the square of the reference wavelength. In an embodiment, the area is less than 10000 micrometer^2, such as less than 5000 micrometer^2, such as less than 2500 micrometer^2, such as less than 1000 micrometer^2, such as less than 500 micrometer^2, such as less than 400 micrometer^2, such as less than 200 micrometer^2. An advantage of such relatively small area may be that it enables the wavelength tunable photon source to withstand larger pressure differences between the inner volume and a surrounding environment. In an embodiment, the area delimited by the bonding interface is arranged so that a pressure difference between the inner volume and an exterior volume, such as the atmosphere, during normal use, such as 1 atmosphere, does not cause a deflection of the walls of the inner volume of more than $\frac{1}{1000}$ lambda, such as more than $\frac{1}{100}$ lambda.

In another embodiment, there is provided a wavelength tunable photon source, wherein a resonance frequency of the first mirror is higher than 0.5 MHz, such as higher than 1 MHz, such as higher than 5 MHz, such as higher than 10 MHz, such as higher than 50 MHz, such as higher than 100 MHz. An advantage of such relatively high resonance frequency may be that it enables driving, i.e., moving, the first mirror at this relatively high frequency with relatively large amplitude at relatively little power consumption.

In another embodiment, there is provided a wavelength tunable photon source, wherein a tuning range in relation to a reference wavelength, is larger than 5%, such as larger than 7.5%, such as larger than 10%, such as larger than 12.5%, such as larger than 15%. A possible of such relatively large tuning range, may be that the photon source may be applicable for a wider range of wavelengths. In an embodiment there is provided an optically pumped photon source wherein the tuning range is larger than 10%, such as larger than 12.5%, such as larger than 15%. In an embodiment there is provided an electrically pumped photon source wherein the tuning range is larger than 5%, such as larger than 6.5%, such as larger than 7.5%, such as larger than 10%.

In another embodiment, there is provided a wavelength tunable photon source, wherein a pressure in the inner volume is above or below an atmospheric pressure, such as a standard atmospheric pressure.

In another embodiment, there is provided a wavelength tunable photon source wherein the first mirror is placed in the inner volume and where at least a portion of the inner volume is placed on a side of the first mirror facing the optical cavity and where at least a portion of the inner volume, such as another portion of the inner volume, is placed on an opposite side of the first mirror, such as a side of the first mirror being opposite of the side of the first mirror facing the optical cavity.

It may thus be understood, that the side of the first mirror which faces the optical cavity is placed away from an outer wall of the inner volume, such as not placed in contact with an outer wall of the inner volume and that the opposite side of the first mirror is placed away from an outer wall of the inner volume, such as not placed in contact with an outer wall of the inner volume. By 'portion of the inner volume' may be understood a part of the inner volume, such as a sub-part of the inner volume. By 'another portion of the inner volume' may be understood another part of the inner volume, such as another sub-part of the inner volume.

It may be understood that
the portion of the inner volume being on the side of the first mirror facing the optical cavity, and
the portion of the inner volume being placed on the opposite side of the first mirror
may be fluidically connected, such as connected via through-going holes in the first mirror. An advantage of having these two portions being fluidically connected may be that it may enable ensuring that the pressure in each of the two portions of the inner volume, such as the portions of the inner volume on each side of the first mirror, is the same.

In an embodiment, the sealed inner volume has a leak rate which is lower than corresponding to 10 mbar pr. 10 years, such as lower than 1 mbar pr. 10 years, such as lower than 0.1 mbar pr. 10 years. It may be understood, that the leak rate may be given for a wavelength tunable photon source when being placed in standard atmospheric conditions.

In another embodiment, the sealed inner volume has a leak rate of no more than $1 \times 10{-20}$ cc of gas/sec at 1 atmosphere differential pressure (where cc refers to cubic centimeters), such as no more than $5 \times 10{-21}$ cc of gas/sec at 1 atmosphere differential pressure, such as no more than $1 \times 10{-21}$ cc of gas/sec at 1 atmosphere differential pressure, such as no more than $5 \times 10{-22}$ cc of gas/sec at 1 atmosphere differential pressure, such as no more than $1 \times 10{-22}$ cc of gas/sec at 1 atmosphere differential pressure.

In an embodiment, a pressure in the inner volume is above or below an atmospheric pressure, such as above or below a standard atmospheric pressure.

In an embodiment, the sealed inner volume has a leak rate which is lower than corresponding to 10 mbar pr. 10 years, such as lower than 1 mbar pr. 10 years, such as lower than 0.1 mbar pr. 10 years. It may be understood, that the leak rate may be given for a wavelength tunable photon source when being placed in standard atmospheric conditions, and wherein a pressure in the inner volume is above or below an atmospheric pressure, such as above or below a standard atmospheric pressure.

In another embodiment, the sealed inner volume has a leak rate of no more than $1 \times 10^{-20}$ cc of gas/sec at 1 atmosphere differential pressure (where cc refers to cubic centimeters), such as no more than $5 \times 10^{-21}$ cc of gas/sec at 1 atmosphere differential pressure, such as no more than $1 \times 10^{-21}$ cc of gas/sec at 1 atmosphere differential pressure, such as no more than $5 \times 10^{-22}$ cc of gas/sec at 1 atmosphere differential pressure, such as no more than $1 \times 10^{-22}$ cc of gas/sec at 1 atmosphere differential pressure, and wherein a pressure in the inner volume is above or below an atmospheric pressure, such as above or below a standard atmospheric pressure.

According to a third aspect of the invention, there is provided use of the photon source as provided according to the first aspect or according to the second aspect for generating photons, such as for generating a plurality of photons which differ in wavelength with respect to each other.

The invention may further relate to a method for generating photons, such as for generating a plurality of photons which differ in wavelength with respect to each other, by emitting photons from the photon emitter in the photon source as provided according to the first aspect or according to the second aspect, and moving the first mirror.

In another embodiment, there is provided a use of the photon source for optical coherence tomography (OCT), such as use of said photon source for optical coherence tomography wherein the second mirror is dynamically actuated, such as dynamically actuated at a pressure below standard atmospheric pressure, such as less than 1 atm, such as less than 1 bar, such as less than 100 mbar, such as less than 10 mbar, such as less than 1 mbar, such as less than 0.1 mbar. A possible advantage of having a relatively low pressure may be that the Q-factor of the movement of the first mirror is increased, which in turn may enable the movement to be achieved using less power.

In another embodiment, there is provided a use of the photon source according to claim for optical communication, such as use of said photon source for optical communication wherein the second mirror is statically actuated, such as statically actuated at a pressure of at least 0.9 bar, such as at least 1 bar, such as at least 1 atm, such as at least standard atmospheric pressure, such as a pressure higher than standard atmospheric pressure, such as at least 1.5 bar, such as at least 2 bar. A possible advantage of having a relatively high pressure may be that the Q-factor of the movement of the first mirror is lowered, such as the movement being damped, such as critically damped. This may in turn enable changes of the position of the mirror to be carried out faster since ringing is reduced.

In a fourth aspect, the present invention relates to a wavelength tunable photon detector, such as a wavelength tunable photon source according to the first and/or second aspect, wherein the photon emitter has been exchanged with a photon absorber and/or wherein the photon emitter may also function as a photon absorber. An advantage of this aspect may be that it enables wavelength selective detection of photons. It may be understood, that in some embodiments, there is provided a wavelength tunable photon detector which may simultaneously be a wavelength tunable photon source, such as wherein the photon emitter may also function as a photon absorber. For example, the photon emitter and photon absorber may be the same element, such as wherein a photon is emitted when a current is supplied and a measurable current may be generated when a photon is absorbed. In an embodiment, the wavelength tunable photon detector comprises an ampere meter for quantifying a current, such as a photocurrent indicative of one or more absorbed photons. In a further embodiment, there is also provided a current source for electrical pumping and/or a light source for optical pumping of a photon emitter.

In an embodiment, the wavelength tunable photon source according to the first aspect and/or the second aspect comprises a current source for electrical pumping and/or a light source for optical pumping.

The first, second and third aspect of the present invention may each be combined with any of the other aspects. These and other aspects of the invention will be apparent from and elucidated with reference to the embodiments described hereinafter.

BRIEF DESCRIPTION OF THE FIGURES

The wavelength tunable photon source according to the invention will now be described in more detail with regard to the accompanying figures. The FIGS. show one way of implementing the present invention and is not to be construed as being limiting to other possible embodiments falling within the scope of the attached claim set.

DETAILED DESCRIPTION OF AN EMBODIMENT

Figure 1:
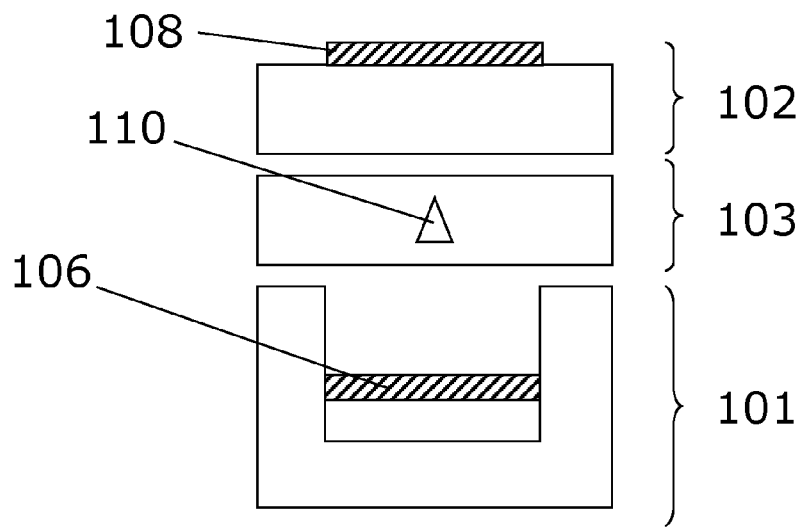
FIG. 1 shows a first, second and third element.

FIG. 1 shows a first element 101 comprising a first mirror 106, a second element 102 comprising a second mirror 108, a third element 103 comprising a photon emitter 110. The elements are shown spaced apart. It may be understood that the figure is a section side view, and that the elements may have any shape, e.g., being circular or square when seen from above. It may in particular be understood, that the figure illustrates a section through the first element, and that the depression in the first element 101 may be a non-through-going hole comprising the first mirror 106.

Figure 2:
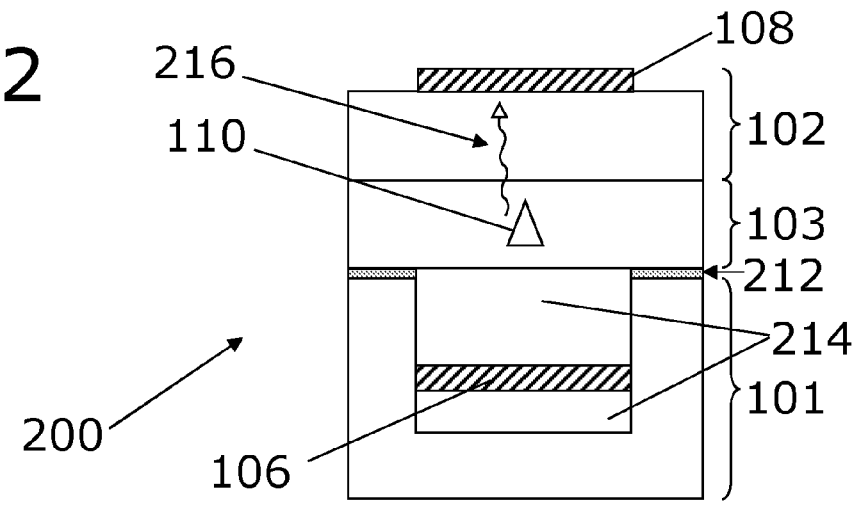
FIGS. 2-3 show embodiments of a tunable photon source.

FIG. 2 shows a wavelength tunable photon source 200 comprising
  a first element 101 comprising a first mirror 106,
  a second element 102 comprising a second mirror 108,
  a third element 103 comprising a photon emitter 110,
where the first element 101 and the second element 102 and the third element 103 are placed in relation to each other, so that
  iii. the first mirror 106 and the second mirror 108 define at least a part of an optical cavity, and so that
  iv. the photon emitter 110 is placed inside the optical cavity, so that a photon 216 emitted from the photon emitter 110 may enter directly into a cavity mode,
where at least the first element 101 and the second element 102 and the third element 103 are joined together (where the first element 101 and the third element 103 are bonded together and the second element comprises a second mirror deposited on a support structure which is bonded to the third element), in a coherent structure enclosing a inner volume 214 being a sealed volume, and where the coherent structure comprises a bonding interface 212 (illustrated by the grey areas between the first element and the third element) adjacent to the inner volume 214, which bonding interface 212 is gas-tight, abutting on a first side the first element 101 and on a second side the third element 103,
wherein the first mirror 106 is placed in the inner volume 214 so that the first mirror 106 may move within the inner volume 214, and wherein the wavelength tunable photon source 200 further comprises means for enabling moving the first mirror within the inner volume. The figure shows that the photon emitter is placed inside the optical cavity, between the first and second mirror, so that an emitted photon 216 may be emitter from within the cavity and directly into a cavity mode. In another embodiment, the second element could substantially consist of the second mirror, which could be deposited directly onto the third element, and thereby joined to the third element.

Figure 3:
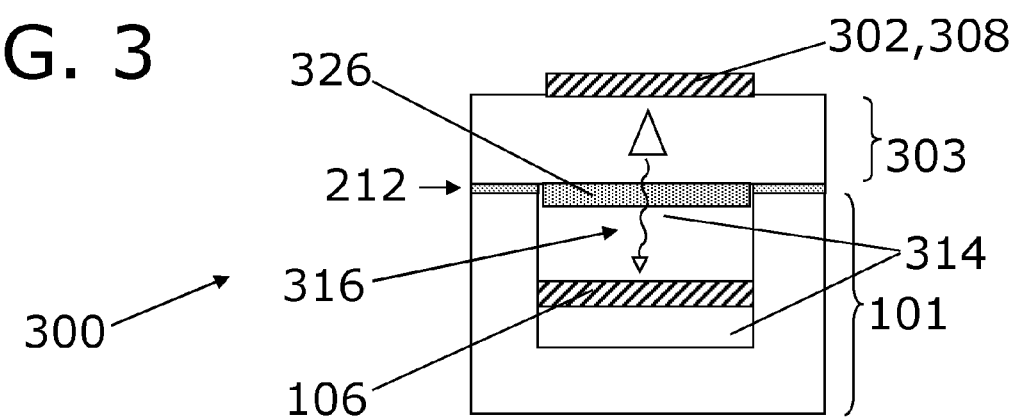

FIG. 3 is a photon source 300 which is similar to the photon source 200 in FIG. 2 except that there is placed an anti-reflection 326 on the surface of the third element 303 which faces the inner volume 314, which coating ensures that there is little or no reflection for photons, such as photons of certain wavelengths, passing this surface. In the embodiment shown in FIG. 3 an emitted photon 316 is emitted directly into a cavity mode. Furthermore, in this embodiment, the second element 302 is embodied by the second mirror 308 which is deposited directly onto the third element 303.

Figure 4:
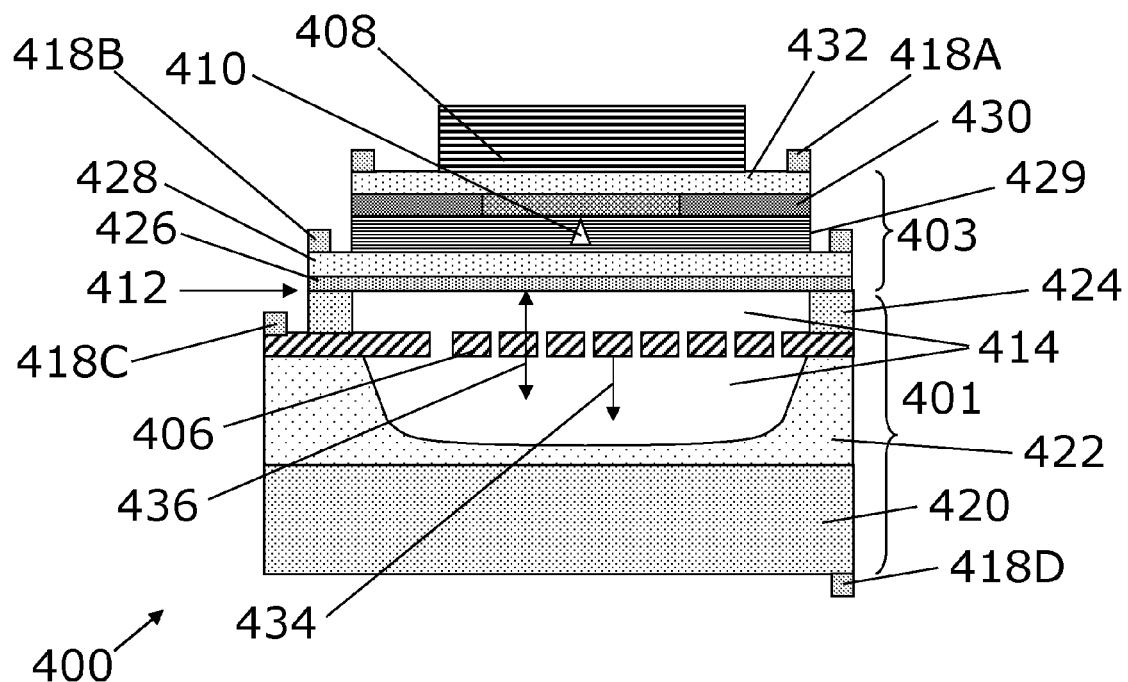
FIG. 4 shows a detailed schematic (side view) of a tunable photon source.

FIG. 4 shows a detailed schematic (side view) of a tunable photon source, which in the present embodiment is an electrically pumped tunable laser, comprising a first element 401 comprising
  a carrier wafer 420, such as doped Si,
  a spacer layer 422 which has a non-through-going hole enclosing the lower part of volume 414. The spacer layer 422 may be $SiO_2$ etched by HF,
  a first mirror 406, which is a micro-electromechanical system (MEMS) mirror, such as an HCG mirror made in silicon,
  a spacer 424, such as thermally grown $SiO_2$ or LPCVD $Si_3N_4$.

The etching of the spacer layer 422 may be done in a way where the remaining thickness of $SiO_2$ towards the silicon substrate is substantially equal to an odd integer times a quarter reference wavelength thereby providing a partial AR coating towards the substrate.

The first mirror may for example be actuated by applying a voltage across the electrode 418C placed on the first mirror and the electrode 418D placed on carrier wafer 420, thereby generating an electrical field between the first mirror 406 and the carrier wafer 420 so as to attract the first mirror 406 to the carrier wafer 420. By applying a static potential this way, the mirror may be statically deflected as indicated by the single-headed arrow 434, i.e., away from the second mirror. The first mirror may for example be actuated by applying a voltage across the electrode 418C placed on the first mirror and the electrode 418B placed on n-doped semiconductor 428 (which itself is placed on anti-reflection (AR) coating 426 (e.g. TiO2/SiO2, Al2O3, SiON)), thereby generating an electrical field between the first mirror 406 and the n-doped semiconductor 428 so as to attract the first mirror 406 to the n-doped semiconductor 428. By applying a static potential this way, the mirror may be statically deflected towards the second mirror, i.e., in a direction opposite the direction indicated by the single-headed arrow 434. By applying a dynamically varying potential between electrode 418B and electrode 418C or between electrode 418C and electrode 418D, such as a temporally sinusoidal potential with a frequency matching half the mechanical resonance frequency of the first mirror 406 (or overtones thereof), the first mirror may be dynamically actuated so as to dynamically oscillate around its equilibrium position as indicated by the double-headed arrow 436. The first element 401 is bonded to a third element 403 at a gas-tight bonding interface 412. The third element comprises a photon emitter 410 being an active electro-optic material (e.g. quantum wells (QWs)). In the present embodiment, the photon emitter 410 is comprised within active region 429. In more general embodiments, the active region may comprise quantum structures (e.g., quantum wells, quantum wires, quantum dots, etc.). The third element in the present embodiment also comprises an anti-reflection (AR) coating 426 (e.g. $TiO_2/SiO_2$, $Al_2O_3$, SiON),
an n-doped semiconductor 428,
a current confining structure 430 placed above the photon emitter 410,
a p-doped semiconductor 432.

The photon emitter 410 may be electrically pumped via electrode 418A and electrode 418B (the electrodes 418A-B a may also be seen as a part of the third element 403). In an alternative embodiment, the photon emitter 410 may be pumped optically, e.g., via an external light source emitting light of a wavelength being smaller than a reference wavelength of the photon source, and where the light from the external light source is led into the optical cavity through, e.g., the second mirror 408.

The current confining structure depends on material system. It is a means for ensuring that the current is only running in the middle of the structure, such as where the laser emission, will take place. It can be realized in numerous ways, such as via isolating material (e.g. Oxidized AlGaAs forming AlOx or semi-insulating semiconductor by implanting deep traps, e.g. hydrogen or iron). Alternatively, the current may be controlled through a n-p-n structure where one of the p-n transitions is a tunnel junction which may be patterned or intermixed by implantation to form a current barrier. Alternatively, the current may be controlled by an air-post structure. Current confining structures are known to the skilled person, and are for example described (as 'dielectric aperture' or 'current aperture') in the reference US 2012/10008658 A1 which is hereby incorporated by reference in entirety.

The photon source 400 furthermore comprises a second mirror 408 which in the present embodiment may be a DBR mirror (e.g. $Si/SiO_2$).

The figure furthermore shows a cavity 414, i.e., an inner volume, wherein the first mirror 406 may move. The cavity 414 may be kept at a pressure below atmospheric pressure, such as under vacuum, which may be advantageous for increasing the Q-factor (which may be advantageous when operated in dynamic mode). Alternatively the pressure in the cavity is higher than atmospheric pressure, which may be advantageous for increasing damping (which may be advantageous when operated in static mode).

In specific embodiments, the cavity 414 may be filled with a gas composition being different from atmospheric air, such as comprising a relatively higher amount of e.g. He, $H_2$ or $N_2$. Having an inert gas sealed inside the inner volume, i.e., cavity 414, may be advantageous since it may improve thermal performance and/or increase or reduce dampening of the first mirror 406 (such as with respect to, e.g., atmospheric air at the same pressure). In general, it is understood that the skilled person may choose pressure and gas composition in order to improve thermal conduction and/or in order to increase or reduce damping, so as to have properties tailored for a specific application (e.g., relatively high thermal conductivity and low damping). Helium may for example improve the thermal properties, and may furthermore reduce damping (compared to, e.g. atmospheric air at the same pressure) due to its relatively low viscosity. In an embodiment, the cavity 414 may be filled (e.g., at a pressure of 0.1, 0.5, 0.75, 0.9, 1.0, 1.25, 2.0 atm) with a gas having relatively high thermal conductivity and viscosity with respect to atmospheric air, such as sulphur hexafluoride ($SF_6$). An advantage thereof may be that it facilitates heat transport away from the first mirror and may simultaneously ensure high damping so as to avoid ringing.

Figure 5:
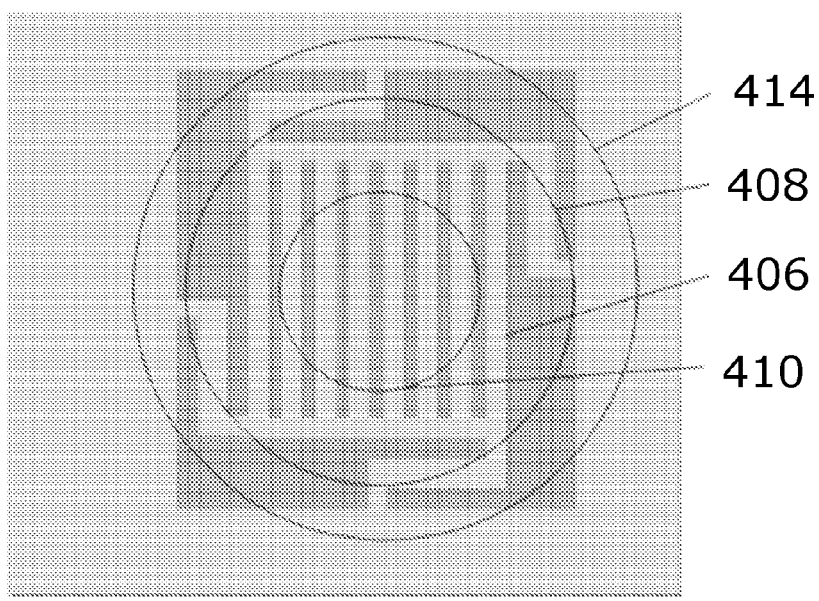
FIG. 5 shows a schematic (top-view) corresponding to the schematic in FIG. 4, FIGS. 6-14 illustrate a method of manufacture.

FIG. 5 shows a top-view corresponding to the schematic in FIG. 4.

Example 1

Method of Manufacture of a Photon Source

In this example, an exemplary method of manufacture is described.

Figure 6:
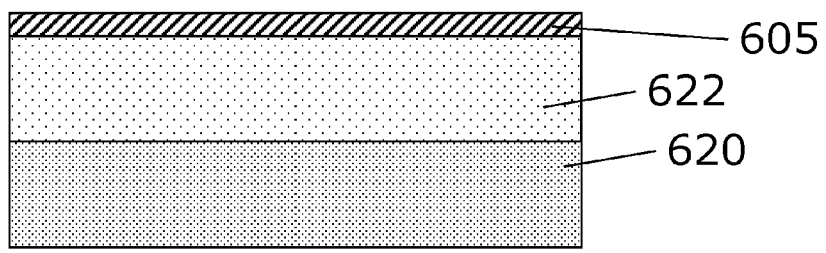

FIG. 6 shows a GaAs/AlAs or GOI/SOI wafer (a MEMS wafer) which is procured, e.g., from a wafer foundry with a specified thickness (or the device layer can be thinned). The illustrated structure, a SOI wafer, comprises a silicon layer 620, a so-called BOX oxide layer which is a $SiO_2$ layer 622 (being approximately 2 micrometers thick) and a top silicon layer 605 (being approximately 580 nm thick).

Figure 7:
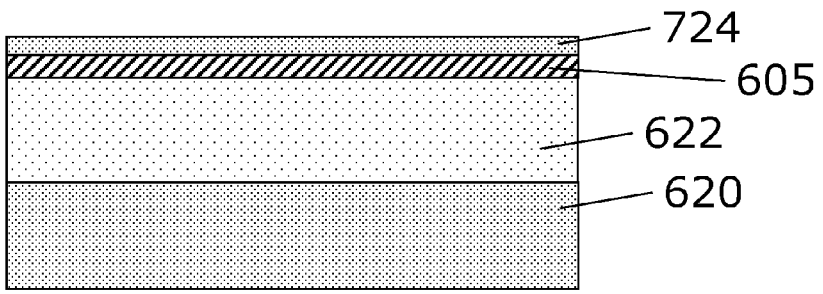

FIG. 7 shows the structure of FIG. 6 where a silicon oxide layer 724 (being approximately 388 nm thick) is grown by thermal oxidation of the upper 170 nm of the top silicon layer 605 (this silicon oxide layer will eventually correspond to the spacer 424 shown in FIG. 4).

Figure 8:
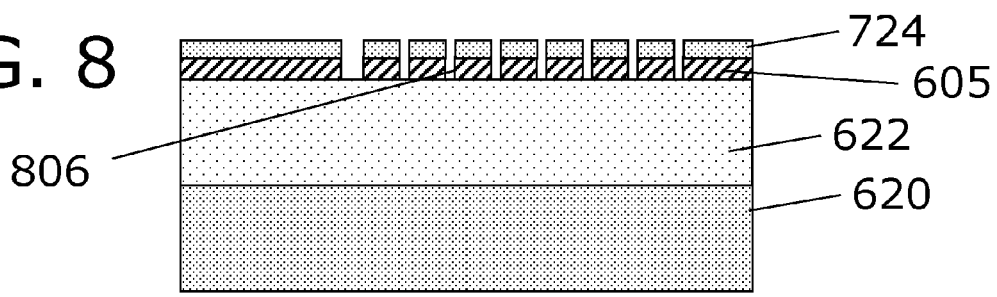

FIG. 8 shows the structure of FIG. 7 where deep UV lithography, nano-imprint lithography or e-beam lithography is used to pattern a dry etch mask for the high-index-contrast subwavelength grating (HCG) (which corresponds to the first mirror 806) which also forms a micro-electro-mechanical-system (MEMS) which is formed in the a top silicon layer 605. The pattern is transferred by reactive ion etching (well known in the art).

Resist 938 is spun on. UV lithography is used to pattern the resist, the pattern being transferred to the spacer 724 to form the non-through-going hole in $SiO_2$ layer 622, which non-through-going hole will form at least part of the inner volume. The spacer 724 is only removed in the area where the Si structuring is carried out. It will remain in most of the wafer and used for the bonding. Vent lanes may be applied as part of the bonding area as known in the art.

Figure 9:
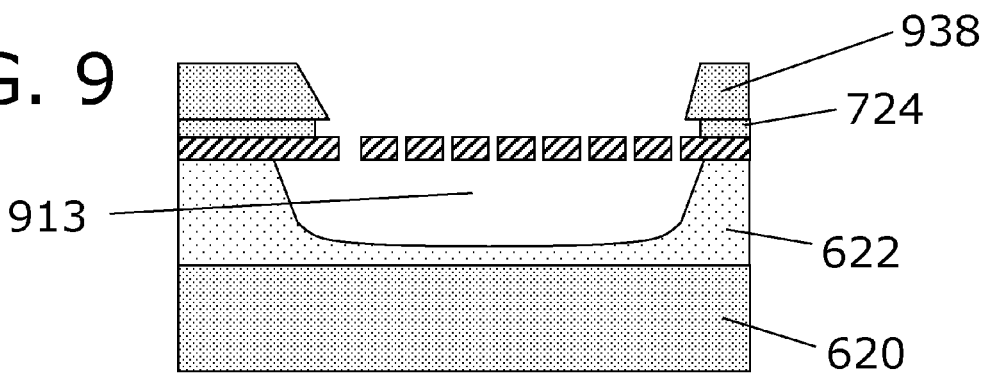

FIG. 9 shows the structure of FIG. 8 where sacrificial release of the MEMS (i.e., the first mirror 806) (etching of the BOX oxide 622) is done using liquid or vapor phase hydrofluoric (HF) acid. To improve adhesion Cr or other known ways to promote adhesion of the resist 938 can be used.

Figure 10:
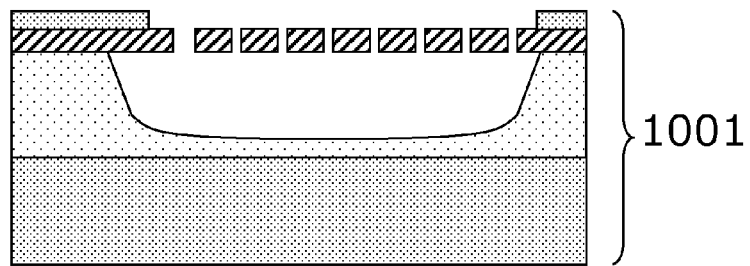

FIG. 10 shows the structure of FIG. 9 where the resist 938 is removed by oxygen plasma ashing or solvents, optional adhesion layer removed by wet etching and the wafer is cleaned in RCA1 ($NH_4OH:H_2O_2:H_2O$) and RCA2 (HCl: $H_2O_2:H_2O$) and dried using critical point drying. The structure shown in FIG. 8 corresponds to a first element 1001 corresponding to the first element 401 in FIG. 4.

Figure 11:
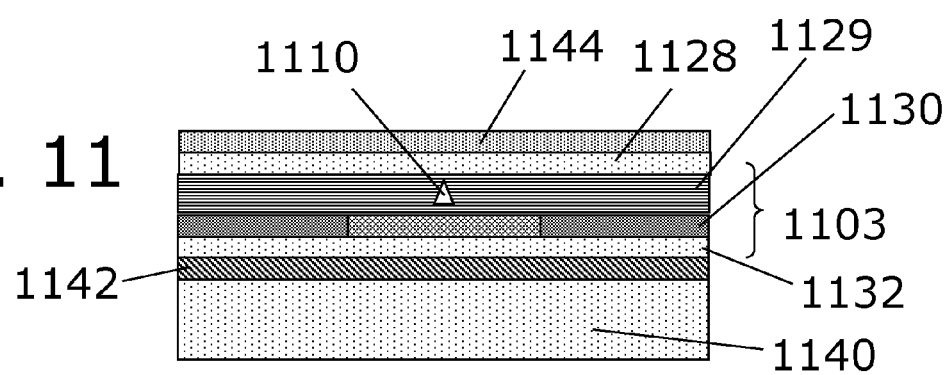

FIG. 11 shows a half-VCSEL structure which is procured, e.g., from an epitaxial wafer foundry. The epitaxial structure comprises an etch-stop layer 1142, e.g. InGaAs, a p-doped layer 1132, e.g. InP:p, a current constriction 1130 (tunnel junction/proton implant/dielectric aperture), an active region 1129 comprising a photon emitter 1110, e.g., multiple quantum wells, e.g. AlInGaAs, and an n-doped layer 1128, e.g InP:n. Alternatively to using a current constriction as described an etched mesa design can be employed. The figure furthermore shows a substrate 1140. A dielectric coating 1144 (anti-reflective coating) is deposited on the half-VCSEL, e.g. siliconoxynitride with a refractive index substantially equal to the square root of the refractive index of the n-doped layer 1128.

It is noted that the p-doped layer 1132, the current constriction 1130, an active region 1129 comprising the photon emitter 1110, e.g., multiple quantum wells, e.g. AlInGaAs, and the n-doped layer 1128, correspond to a third element 1103 (corresponding to the third element 403 in FIG. 4) which in the present figure may be 1.5-4.5 lambda thick. In the present embodiment, the third element 1103 also comprises the dielectric coating 1144.

Figure 12:
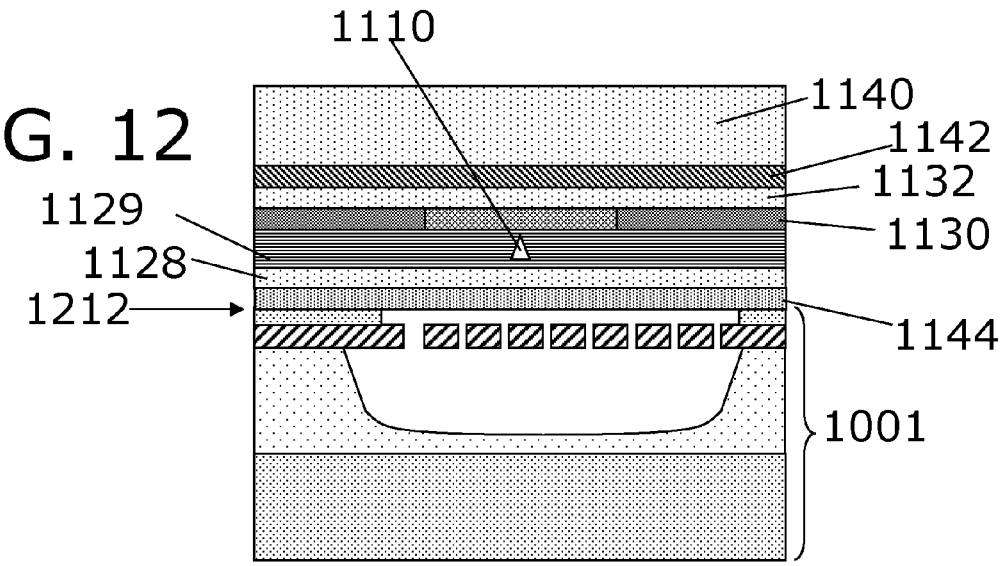

FIG. 12 shows the half-VCSEL structure of FIG. 11 (albeit upside-down compared to FIG. 11) and the first element 1001 from FIG. 10 where The half-VCSEL and the first element (MEMS wafer) are bonded together (e.g., using fusion bonding), so as to form a gas-tight bonding interface 1212 between the first element 1001 and the third element (more particularly the dielectric coating 1144 of the third element 1103).

Figure 13:
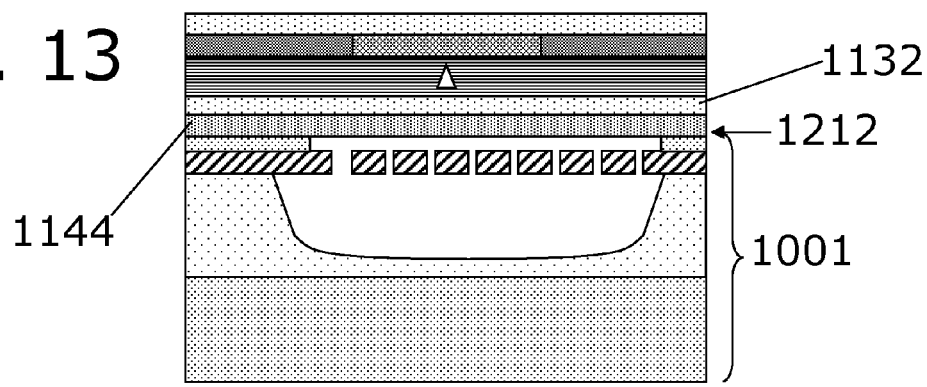

FIG. 13 shows the structure of FIG. 12 where the substrate 1140 (in FIG. 11) is removed by wet etching e.g. using hydrochloric acid (HCl). The etch stop layer 1142 (i.e., the InGaAs layer) is removed by wet etching (e.g. a mixture of sulfuric acid and hydrogen peroxide).

Figure 14:
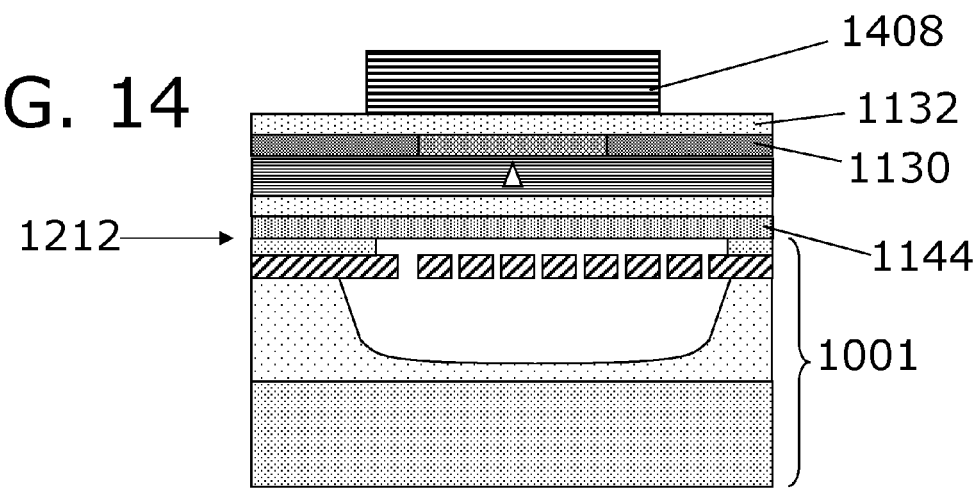

FIG. 14 shows the structure of FIG. 13 where a thin-film stack, a distributed Bragg reflector 1408 corresponding to the second mirror (and where the second mirror corresponds to the second element), is deposited onto a lift-off resist patterned by lithography or and patterned by lithography and wet or dry etching. In an alternative embodiment, the second mirror could be deposited on a separate structure, which together with the second mirror forms the second element, where the second element is then joined, such as bonded, to the first element and the second element.

In order to arrive at a structure similar to the photon source 400 in FIG. 4, UV lithography and wet or dry etching may be used to pattern a structure/mesa for making an intra-cavity contact to the n-doped layer. UV lithography and wet or dry etching may be used to pattern a structure/mesa for making contact to part of the first mirror, i.e., the MEMS. Electrical contacts are patterned by UV lithography, e.g. either lift-off or wet or dry etching. Optionally metal can be deposited to the backside of the wafer at any time in the process. Metal stacks for ohmic contacts are well-known in the art.

To sum up, there is presented a method of providing a wavelength tunable photon source (200), comprising bonding a first element (101) with a first mirror (106), a second element (102) with a second mirror (108) and a third element (103) with a photon emitter together in a structure enclosing an inner volume (214) being a sealed volume, and forming a bonding interface (212) which is gas-tight, so that the first mirror (106) is placed in the inner volume (214) so the first mirror (106) may move within the inner volume (214). The method provides a relatively simple way of obtaining a tunable photon source where the inner volume is sealed. The invention furthermore relates to a corresponding photon source, and use of such photon source.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method of providing a wavelength tunable photon source, the method comprising
providing a first element, comprising a first mirror,
providing a second element, comprising a second mirror,
providing a third element, comprising a photon emitter,
placing the first element and the second element and the third element (103) in relation to each other, so that
i. the first mirror and the second mirror define at least a part of an optical cavity, and so that
ii. the photon emitter is placed inside the optical cavity,
joining at least the first element and the second element and the third element together in a coherent structure enclosing an inner volume being a sealed volume, and
forming a bonding interface adjacent to the inner volume, which bonding interface is gas-tight, abutting on a first side the first element (101) and on a second side the third element,
wherein
the first mirror is placed in the inner volume so that the first mirror may move within the inner volume and where at least a portion of the inner volume is placed on a side of the first mirror facing the optical cavity and where at least a portion of the inner volume, is placed on an opposite side of the first mirror, and wherein an electrical, piezo-electrical, thermal or mechanical actuator is configured to move the first mirror within the inner volume.

2. The method according to claim 1, wherein forming the bonding interface comprises forming the bonding interface by direct bonding.

3. The method according to claim 1, wherein the step of forming the bonding interface is preceded by a step of providing a pressure above or below an atmospheric pressure, so as to provide a corresponding pressure above or below the atmospheric pressure in the inner volume after the step of forming the bonding interface.

4. The method according to claim 1, wherein the method comprises placing an anti-reflection coating on at least a portion of a surface of the third element which delimits the inner volume.

5. A wavelength tunable photon source comprising
a first element comprising a first mirror,
a second element comprising a second mirror, and
a third element comprising a photon emitter,
where the first element and the second element and the third element are placed in relation to each other, so that
i. the first mirror and the second mirror define at least a part of an optical cavity, and so that
ii. the photon emitter is placed inside the optical cavity,
where at least the first element and the second element and the third element are joined together, in a coherent structure enclosing a inner volume being a sealed volume, and where the coherent structure comprises a bonding interface adjacent to the inner volume, which bonding interface is gas-tight, abutting on a first side the first element and on a second side the third element, wherein the first mirror is placed in the inner volume so that the first mirror may move within the inner volume and where at least a portion of the inner volume is placed on a side of the first mirror facing the optical cavity and where at least a portion of the inner volume, is placed on an opposite side of the first mirror, and wherein the wavelength tunable photon source further comprises an electrical, piezo-electrical, thermal or mechanical actuator that is configured to move the first mirror within the inner volume.

6. The wavelength tunable photon source according to claim 5, wherein the electrical, piezo-electrical, thermal or mechanical actuator that is configured to move the first mirror within the inner volume comprises an electrode for supporting an electrical field between the first mirror and the electrode so as to move the first mirror.

7. The wavelength tunable photon source according to claim 6, wherein the electrical field is arranged for moving the first mirror in a direction away from the second mirror.

8. The wavelength tunable photon source according to claim 5, wherein the photon emitter is a laser gain medium and wherein the wavelength tunable photon source is configured to emit laser light.

9. The wavelength tunable photon source according to claim 5, which is configured to emit photons at a reference wavelength lambda, wherein an optical path length (OPL) between the first mirror and the second mirror is less than 5 times lambda ($5 \times \lambda_0$).

10. The wavelength tunable photon source according to claim 5, which is configured to emit photons at a reference wavelength lambda, wherein a distance along an optical path in the optical cavity in the inner volume between the first mirror and an opposing solid element is less than 1.0 times lambda ($1.0 \times \lambda_0$).

11. The wavelength tunable photon source according to claim 5, which is configured to emit photons at a reference wavelength lambda, wherein a distance along an optical path in the optical cavity in the inner volume between the first mirror and an opposing solid element is less than $\frac{1}{10} \lambda_0$.

12. The wavelength tunable photon source according to claim 5, which is configured to emit photons at a reference wavelength lambda, wherein an area delimited by the bonding interface is less than 5000 times the square of the reference wavelength (lambda^2).

13. The wavelength tunable photon source according to claim 5, wherein a tuning range in relation to a reference wavelength is larger than 5%.

14. The wavelength tunable photon source according to claim 5, wherein the electrical, piezo-electrical, thermal or mechanical actuator that is configured to move the first mirror within the inner volume comprises an electrode for supporting an electrical field between the first mirror and the electrode so as to move the first mirror, wherein the electrical field is arranged for moving the first mirror in a direction towards the second mirror.

15. The wavelength tunable photon source according to claim 5, wherein the electrical, piezo-electrical, thermal or mechanical actuator that is configured to move the first mirror within the inner volume comprises
   i. an electrode for supporting an electrical field between the first mirror and the electrode so as to move the first mirror, wherein the electrical field is arranged for moving the first mirror in a direction away from the second mirror, and
   ii. an electrode for supporting an electrical field between the first mirror and the electrode so as to move the first mirror, wherein the electrical field is arranged for moving the first mirror in a direction towards the second mirror.

16. The wavelength tunable photon source according to claim 5, wherein the sealed inner volume has a leak rate which is lower than corresponding to 10 mbar for 10 years.

17. The wavelength tunable photon source according to claim 5, wherein the sealed inner volume has a leak rate of no more than $1 \times 10^{-20}$ cc of gas/sec at 1 atmosphere differential pressure.

18. The wavelength tunable photon source according to claim 5, wherein a pressure in the inner volume is above or below an atmospheric pressure.

19. The wavelength tunable photon source according to claim 5, wherein the sealed inner volume has a leak rate which is lower than corresponding to 10 mbar for 10 years, and wherein a pressure in the inner volume is above or below an atmospheric pressure.

20. The wavelength tunable photon source according to claim 5, wherein the sealed inner volume has a leak rate of no more than $1 \times 10^{-20}$ cc of gas/sec at 1 atmosphere differential pressure, and wherein a pressure in the inner volume is above or below an atmospheric pressure.

21. A method for generating photons comprising:
   providing the wavelength tunable photon source according to claim 5, and
   generating photons from said wavelength tunable photon source.

22. A method for conducting optical coherence tomography (OCT) comprising:
   providing the wavelength tunable photon source according to claim 5,
   generating photons from said wavelength tunable photon source; and
   conducting optical coherence tomography (OCT) from the photons generated from said wavelength tunable photon source.

* * * * *